(12) United States Patent
Yamaguchi et al.

(10) Patent No.: US 9,000,366 B2
(45) Date of Patent: Apr. 7, 2015

(54) METHOD AND APPARATUS FOR MEASURING DISPLACEMENT BETWEEN PATTERNS AND SCANNING ELECTRON MICROSCOPE INSTALLING UNIT FOR MEASURING DISPLACEMENT BETWEEN PATTERNS

(71) Applicant: Hitachi High-Technologies Corporation, Tokyo (JP)

(72) Inventors: Atsuko Yamaguchi, Kodaira (JP); Yasunari Sohda, Kawasaki (JP); Tatsuya Maeda, Hitachinaka (JP); Osamu Nasu, Hitachinaka (JP); Hiroki Kawada, Tsuchiura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/855,977

(22) Filed: Apr. 3, 2013

(65) Prior Publication Data
US 2013/0264479 A1    Oct. 10, 2013

(30) Foreign Application Priority Data
Apr. 4, 2012    (JP) ................ 2012-085122

(51) Int. Cl.
   *H01J 37/26*    (2006.01)
   *G01N 23/00*    (2006.01)

(52) U.S. Cl.
CPC ......... *H01J 37/265* (2013.01); *H01J 2237/221* (2013.01); *H01J 2237/24578* (2013.01); *H01J 2237/2817* (2013.01)

(58) Field of Classification Search
CPC ....... H01J 37/147; H01J 37/26; H01J 37/265; H01J 37/30; H01J 37/3005; H01J 37/304; H01J 37/3045
USPC ................................. 250/306–311
See application file for complete search history.

(56) References Cited

U.S. PATENT DOCUMENTS

| | | | |
|---|---|---|---|
| 4,149,085 A | * | 4/1979 | Davis et al. ............... 250/492.2 |
| 6,222,197 B1 | * | 4/2001 | Kojima .................... 250/492.22 |
| 6,407,398 B1 | * | 6/2002 | Kurokawa et al. ....... 250/492.22 |
| 6,563,573 B1 | | 5/2003 | Morohoshi et al. |
| 7,034,321 B2 | * | 4/2006 | Takakuwa et al. ....... 250/492.22 |

(Continued)

FOREIGN PATENT DOCUMENTS

| JP | 2000-088702 A | 3/2000 |
|---|---|---|
| JP | 2009-270988 A | 11/2009 |

OTHER PUBLICATIONS

I. Englard et al., "Metrology challenges for advanced lithography techniques," Proc. of SPIE, vol. 6518, 65181G-1-65181G9 (9 pages total), 2007.

*Primary Examiner* — Nicole Ippolito
*Assistant Examiner* — David E Smith
(74) *Attorney, Agent, or Firm* — Mattingly & Malur, PC

(57) ABSTRACT

In order that a displacement between patterns of different heights, formed on a sample in a plurality of different pattern-forming steps, can be measured at fixed throughput and with high accuracy, correspondence between parameters of lenses and beam deflector of an electron optical system and an angle of incidence of a beam upon the sample is recorded as data, then a correction value for the amount of displacement or edge positions is calculated, and a true amount of displacement is calculated from the correction value and an image under observation.

10 Claims, 6 Drawing Sheets

(56) References Cited

U.S. PATENT DOCUMENTS

2009/0212215 A1* 8/2009 Nagatomo et al. ............ 250/311
2009/0214103 A1* 8/2009 Tanaka et al. ................. 382/145
2011/0037957 A1* 2/2011 Dishon et al. .................. 355/27
2011/0155904 A1* 6/2011 Hotta et al. .................... 250/307

* cited by examiner

METHOD AND APPARATUS FOR MEASURING DISPLACEMENT BETWEEN PATTERNS AND SCANNING ELECTRON MICROSCOPE INSTALLING UNIT FOR MEASURING DISPLACEMENT BETWEEN PATTERNS

CLAIM OF PRIORITY

The present invention claims priority from Japanese Patent Application JP2012-85122 filed on Apr. 4, 2012, the content of which is hereby incorporated by reference into this application.

BACKGROUND OF THE INVENTION

The present invention relates to a method and apparatus using an electron beam to measure a displacement between microstructured patterns, and to a scanning electron microscope using a microstructured-pattern displacement measuring apparatus.

With a growing tendency towards finer LSI circuit pattern structuring, reduction in the magnitude of an overlay error, in addition to the management of pattern sizes, is becoming a vital issue. The overlay error here is an error in the distance between the patterns formed in different processes, with respect to a design value. The layout of patterns is designed so that a silicon (Si) substrate on which a groove pattern has been formed in a process is coated with a resist in another process and then subjected to lithography to form a plurality of line patterns at equidistant positions from the groove pattern. During actual patterning, however, the center of the space region defined by the line patterns usually does not align with the center of the groove pattern. This amount of misalignment between the central position of the line patterns space region and that of the groove pattern is called the overlay (OL) error.

From time to time, each of the three patterns is originally designed so as not to align, in which case the amount of misalignment between a design value and an actual value is often defined as the OL error. In recent years, patterns that have gone through different forming processes exist on the same layer in some cases. For example, line patterns are formed on a Si substrate by the execution of first lithography and then other line patterns are formed on the same substrate by the execution of second lithography. The OL error between the line patterns that have been formed during the second lithography becomes the difference between the center of the line patterns that have been formed during the first lithography, and that of the line patterns formed during the second lithography.

In many cases, OL errors have heretofore been optically measured with the edge positions of patterns as its basis, as disclosed in Japanese Patent Applications JP-2000-88702A and JP-2009-270988A.

However, the tool-induced shift TIS, caused as a measurement error due to the measuring device during the optical measurement of the OL error, has become a problem. The tool-induced shift TIS is an error due to the angle of incidence of irradiation light or to the asymmetry of the irradiation light.

One of the technical solutions considered in JP-2000-88702A is by, after the measurement of the OL error, rotating the target object through 180 degrees with respect to the irradiation light and then canceling out the OL error with the data obtained by the rotation. The correction of other problems such as aberration, as well as the simple correction of the angle of incidence, is also reviewed.

The idea of correcting the TIS itself can be a further solution, as in JP-2009-270988A. For optical measurement, since the focal position during observation has a relationship with TIS, a method of optimizing this relationship has been disclosed.

However, needs of users who wish to measure the OL error as near as possible to vital patterns in the chip are arising in recent years. This is because, although measurements have formerly been conducted with an OL error measurement target pattern disposed at several locations including the corners of the chip, this has been insufficient to accurately predict the OL error of the vital patterns and a yield has not been improvable. Despite those needs, the optical measurement target patterns cannot be disposed at the desired positions since these target patterns are as large as tens of micrometers ($\mu$m) on one side.

SUMMARY

For this reason, attention is being paid to critical-dimension scanning electron microscope (CD-SEM) having a dimensional measuring function. The use of a CD-SEM allows measurement with target patterns measuring several micrometers ($\mu$m) on one side. In addition, measurement on actual patterns may be possible, depending on process conditions.

Observing patterns on a sample using a CD-SEM involves stage movement and beam control to acquire an image of a spot to be observed, for it takes time to move a visual field by merely moving the stage. Beam control is to change parameters of an electron optical system and apply a beam to a desired position on a sample. Problems arise at this time. One of them is that controlling the beam for an orientation towards the desired spot on the sample is likely to cause a situation in which the incident beam does not become perpendicular to the surface of the sample. Another problem is that even if the spot to be observed is present directly under the beam axis, when the electron beam scans the spot, patterns that are more distant from the center of the visual field are irradiated with the incident beam at greater angles.

In both of the above two cases, the incidence angle of the electron beam to the sample is less than 1 degree. Even so, differences in the incidence angle are influential. For a line pattern height of 100 nm, even a 0.5-degree inclination of the incident angle with respect to the perpendicular direction to the sample causes a step-width error of nearly 0.9 nm with respect to the actual width of stepped portions on the sample. The OL error itself is at a level of several micrometers ($\mu$m), so compared with this value, the step-width error cannot be ignored. This problem is capable of being resolved by using any one of the following two methods.

A first method is canceling out the OL error in the first measuring result by using a second measurement result. More specifically, after the first optical measurement, the sample (in many cases, a silicon wafer) is rotated by 180 degrees for reversal of the relationship in position between the sample and the beam, then the sample surface is irradiated from a direction opposite to that of the first irradiation, and the second measurement is conducted. As a matter of fact, an article by I. Englard, et al., "Metrology challenges for advanced lithography techniques", Proc. SPIE, VOL. 6518, pp. 65181G-1-65181G-9 (Non-Patent Document 1), describes a method of canceling out an overlay error by rotating a wafer in an OL measurement process with a CD-SEM.

During the CD-SEM metrology, parallel movement or rotation of the silicon wafer results in the beam being defocused against the wafer surface. This measuring method requires at least three operations. It is necessary first to adjust the visual field to a desired position on the wafer by moving a stage, next to perform readjustments for a recovery from the defocused state, and finally to measure the same section in the second time, so the measuring time is increasing. This measuring time, if simply considered, would be several times as much comparing to the time needed in measuring the sample once without rotation.

A second method is by realizing an electron optical system that allows the beam to be kept perpendicular to the sample at all times. The second method, which requires extensive modification of hardware, does not guarantee the accuracy or convenience of the current apparatus. The modification is also likely to increase the price of the apparatus. That is to say, although the problem associated with the angle of incidence has already been nearly resolved in the conventional optical measurement, the particular problem is likely to arise as a new one to be resolved in the CD-SEM metrology.

The idea of subtracting the TIS value from the measured OL error, that is, correcting the observation results, is discussed in the example of JP-2000-88702A. Since the angle of incidence on the sample is constant during the optical measurement, however, the problem dealt with here in regard to electron microscopy, that is, the problem arising because of the angle of incidence not being constant cannot be resolved by using the method described in JP-2000-88702A.

In order to solve the foregoing problems, the present invention provides an apparatus for measuring a displacement between a plurality of patterns of different heights, formed on a sample in different pattern-forming steps, while irradiating the sample with an electron beam from a scanning electron microscope and observing the sample through the microscope, the apparatus including a control unit that controls a converging lens, deflector, objective lens, and sample stage of the scanning electron microscope as well as the electron beam of the microscope, a computer that cooperate with the control unit and calculates the displacement, and a data recorder; wherein the data recorder previously records data that represents correspondence between respective control values of the converging lens, objective lens, and deflector operative when the electron beam is being scanned, and an angle of incidence of the electron beam upon the sample during the scan, and the computer includes means that allows entry of the pattern heights, and a storage region for temporary storage of image data obtained during the observation, and has a function that calculates the displacement between the patterns formed in the different pattern-forming steps, from a value that represents correspondence between the pattern height values and the measured image data obtained during the observation.

The computer further includes a graphical user interface screen, on which the computer provides a function that displays the pattern image, a function that enables entry of data on the pattern height, a function that calls correspondence data recorded in a data recorder and temporarily stores the called data into an internal storage region of the computer, and a function that calculates the displacement and displays a result of the calculation.

In addition, the control values of the converging lens, objective lens, and deflector operative when the electron beam is being scanned are either of values obtained when the electron beam is scanning a central portion of the image obtained during the observation, or values obtained when the electron beam is scanning the image obtained during the observation.

A method for observing through a scanning electron microscope a sample on which a plurality of patterns of different heights are formed in a plurality of different pattern-forming steps, and measuring a displacement between the patterns formed in the different pattern-forming steps, the method comprising the steps of: entering height information of the patterns into a computer; recording data that represents correspondence between respective control values of a converging lens, objective lens, and deflector of a scanning electron microscope observing the sample, the control values being used to control a direction of an electron beam incident upon the sample, and a deviation in an angle of incidence of the electron beam upon the sample with respect to a direction perpendicular to the sample; storing into the computer the respective control values of the converging lens, objective lens, and deflector operative when the sample is being observed; acquiring an image of the sample while observing the sample through the scanning electron microscope; and calculating the displacement between the patterns, by use of the correspondence data recorded in the recording step, the computer-stored control values of the converging lens, objective lens, and deflector existing during the observation, the pattern height values, and the image being observed.

In addition, the control values of the converging lens, objective lens, and deflector that change during the observation through the scanning electron microscope are previously recorded, then a relationship between pattern edge coordinate positions in the image being observed and the deviation in angle are determined from the control values, and the amount of displacement between the patterns is calculated from the relationship between the pattern edge coordinate positions in the image being observed and the angle deviation, the pattern heights, and the image being observed.

The displacement measuring apparatus and method according to the present invention allow an observing visual field to be moved by conducting substantially the same stage movements and beam adjustments as before. This provides at least an advantage that correction of measured data according to the particular angle of incidence of the beam can be conducted with throughput maintained at its original high level.

These features and advantages of the invention will be apparent from the following more particular description of preferred embodiments of the invention, as illustrated in the drawings.

DESCRIPTION OF THE PREFERRED
EMBODIMENTS

Figure 1:
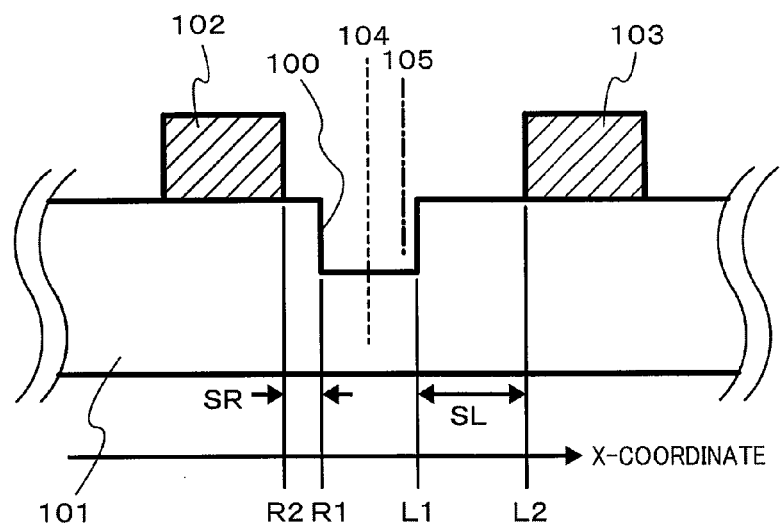
FIG. 1 is a schematic diagram of cross sectional shape of patterns to illustrate a definition of an overlay error.

First, the following description gives a definition of an overlay (OL) error in patterns formed on a silicon (Si) substrate in different process steps. FIG. 1 is a schematic diagram that shows cross-sectional shapes of line patterns 102 and 103 formed by lithography with a resist applied to a Si substrate 101 having a groove pattern 100 preformed thereon. A dotted line 104 denotes a central position of the groove pattern 100 on the Si substrate 101. A dashed line 105 denotes a central position of a space region defined by the line patterns 102 and 103. According to a layout design, the central position 104 of the groove pattern 100 and the central position 105 of the space region defined by the line patterns 102 and 103 are essentially matching with each other. In actual process steps, however, it is not common for the central positions 104 and 105 to align, as shown in FIG. 1. A distance between the central position 104 of the groove pattern 100 and the central position 105 of the space region defined by the line patterns 102 and 103 is called a displacement or an overlay (OL) error.

Left and right edge positions of the groove pattern formed at the first time as shown in FIG. 1 are defined as L1 and R1, respectively. In dimensional measurement, line-and-space patterns are commonly focused on lines, a point equivalent to a right edge of each line pattern (in a space, this point is equivalent to a left edge) is represented as L. Left and right edge positions of the resist patterns formed at the second time are defined as L2 and R2, respectively likewise the groove pattern formed at the first time. The OL error, or the displacement, can then be defined as in expression 1 (hereinafter, the OL error may be conveniently abbreviated as OL in individual expressions).

$$OL=(L2+R2)/2-(L1+R1)/2 \quad \text{(Expression 1)}$$

This expression can be transformed as follows:

$$OL=((L2-L1)-(R1-R2))/2=(SL-SR)/2 \quad \text{(Expression 2)}$$

where SL denotes width of a step formed by the left edges, that is, a shift in position between L1 and L2, and SR denotes a shift in position between the right edges R1 and R2. By measuring the two values, the OL error can be determined.

Figure 2:
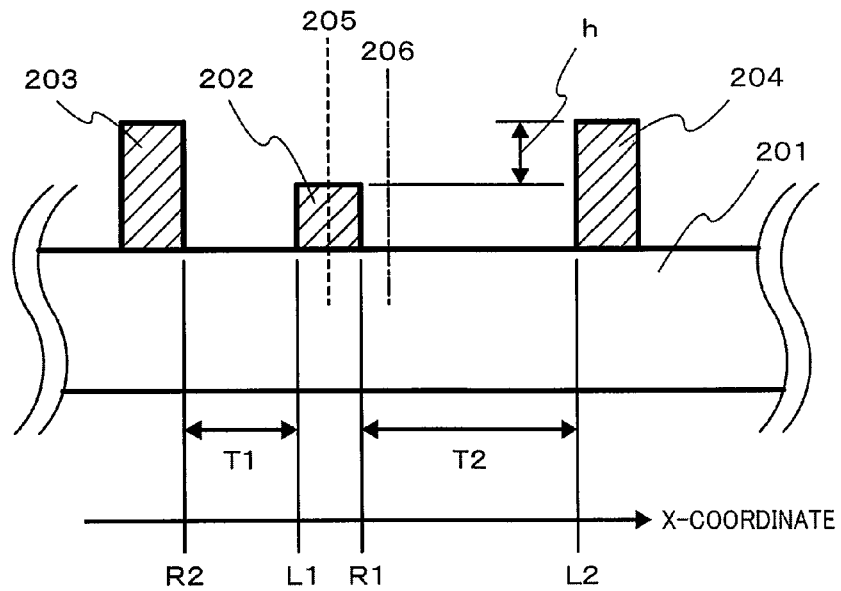
FIG. 2 is a schematic diagram of cross sectional shape of other patterns to illustrate a definition of an overlay error.

FIG. 2 is a schematic diagram that shows cross-sectional shapes of two kinds of resist line patterns formed by the double patterning process. On a Si substrate 201, the line pattern 202 is formed by the first lithography operation, and after this, the line patterns 203 and 204 are formed by the second lithography operation. The OL error in the two lithographic patterning operations causes a shift in position between dotted line 205 extending through a central portion of the line pattern 202, and dashed line 206 extending through a midpoint of the line patterns 203 and 204. That is to say, using L1, L2, R1, R2 shown in FIG. 2 allows the OL error to be defined as in expression 1. Expression 1 can be transformed as follows:

$$OL=((L2-L1)-(L1-R2))/2=(T2-T1)/2 \quad \text{(Expression 3)}$$

where T1 and T2 denote trench widths shown in FIG. 2. By measuring the above two dimensions, the OL error can be calculated.

Next, the TIS in the simplest conceivable case is described below using FIG. 3.

Figure 3:
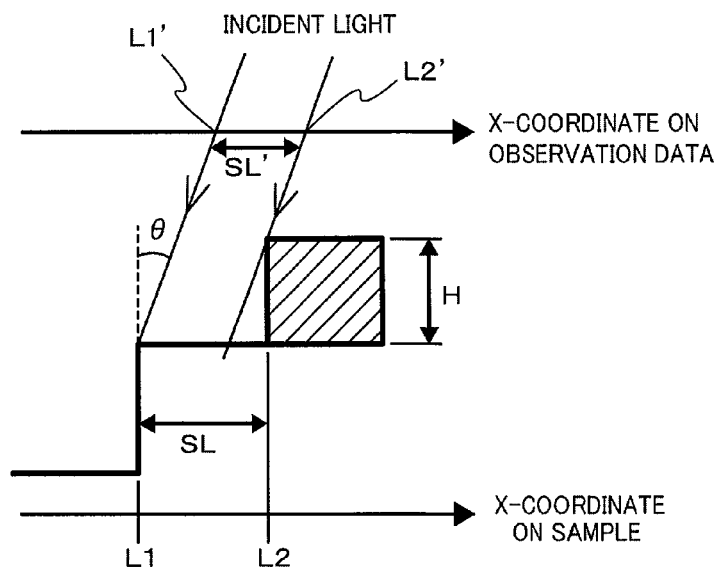
FIG. 3 is a schematic diagram of cross sectional shape of a pattern representing a relationship between a pattern section and incident light during overlay error measurement.

FIG. 3 is a schematic diagram showing an influence of an angle of incidence in a case of calculating the OL error from measurement results on such steps as shown in FIG. 1. Suppose that incident light is parallel light. Also, suppose that the incident light for observing the edge positions is emitted from a direction of an angle $\theta$ with respect to a perpendicular direction to the sample. The dimension to be measured in this case is SL, or the distance between L1 and L2. On the data observed, L1 and L2 are recognized as positions of L1' and L2', respectively, the value SL' to be measured is smaller than a true value of SL. This can be expressed as follows:

$$SL'=SL-H\cdot \tan \theta \quad \text{(Expression 4)}$$

Let the second term on the right side of this expression be rewritten as $\Delta$.
Similarly, a value to be measured for observing R1, R2 can be represented as follows:

$$SR'=SR+\Delta \quad \text{(Expression 5)}$$

Therefore, $$OL'=OL-\Delta \quad \text{(Expression 6)}$$

holds between OL, or a true value of the OL error, and OL', or the observed OL error.

The case of double patterning, shown in FIG. 2, can also be represented using expression 6. In this case, $\Delta$ is given as in expression 7.

$$\Delta=h\cdot \tan \theta \quad \text{(Expression 7)}$$

where "h" is the difference in height between the pattern formed by the first time lithography and the pattern formed by the second time lithography, that is, the difference in height between the line patterns 202 and 203 in FIG. 2.

First Embodiment

The first embodiment of the present invention is described below. The first embodiment, described below by referring FIGS. 1 to 8, is an example in which a plurality of pattern regions lying in a relatively wide region are observed and an OL error is measured with high accuracy.

Figure 4:
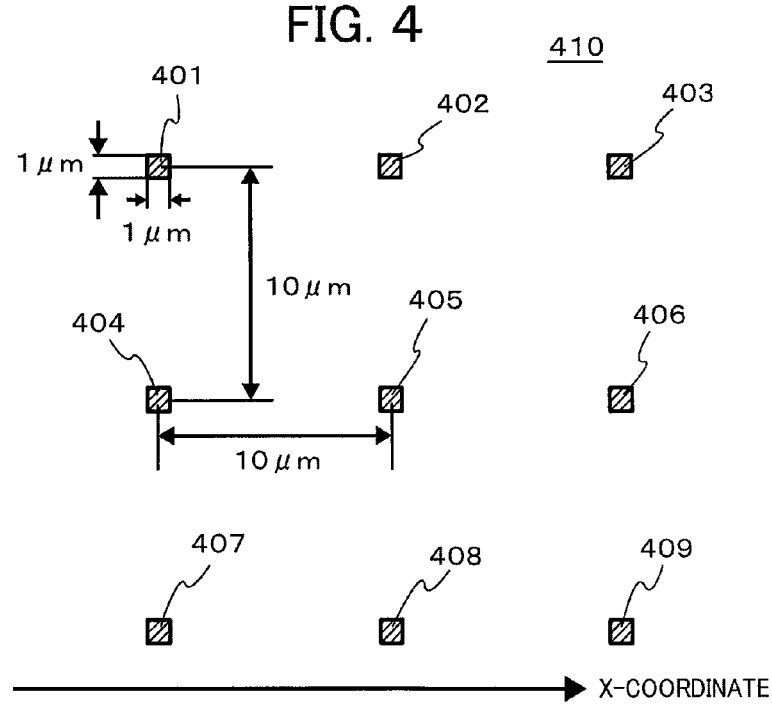
FIG. 4 is a layout diagram of patterns on a silicon wafer surface under observation in a first embodiment.
Figure 5:
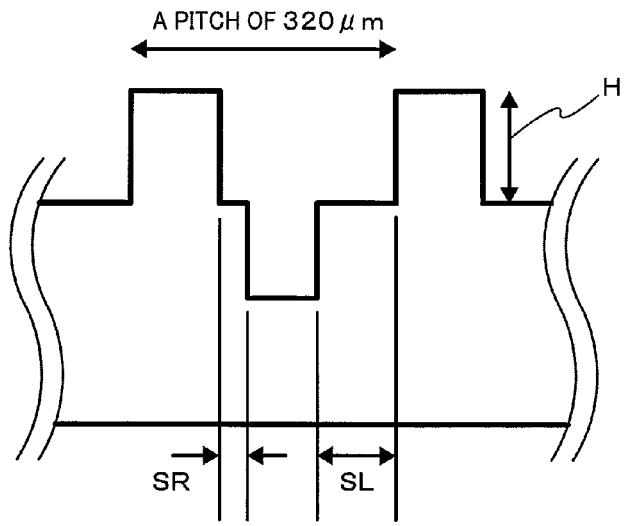
FIG. 5 is a schematic diagram of cross sectional shape of the patterns observed in the first embodiment.

FIG. 4 is a diagram representing a relationship in position between nine observed spots. Target patterns 401 to 409 marked by hatching in the figure denote the nine spots. These patterns are formed on a silicon wafer 410, with a notch of the wafer being positioned at a lower side of FIG. 4. The size of the spots is 1 μm on one side, and a spacing from a central portion of one spot to that of another spot is 10 μm. In addition, such a line-and-space pattern as shown in FIG. 5 is formed on each spot. FIG. 5 shows cross sectional shapes of the target patterns. The patterns are each formed from etched silicon and pitched at 320 nm. The target patterns are formed to measure the OL error by measuring dimensions SL and SR shown in FIG. 5.

Figure 6:
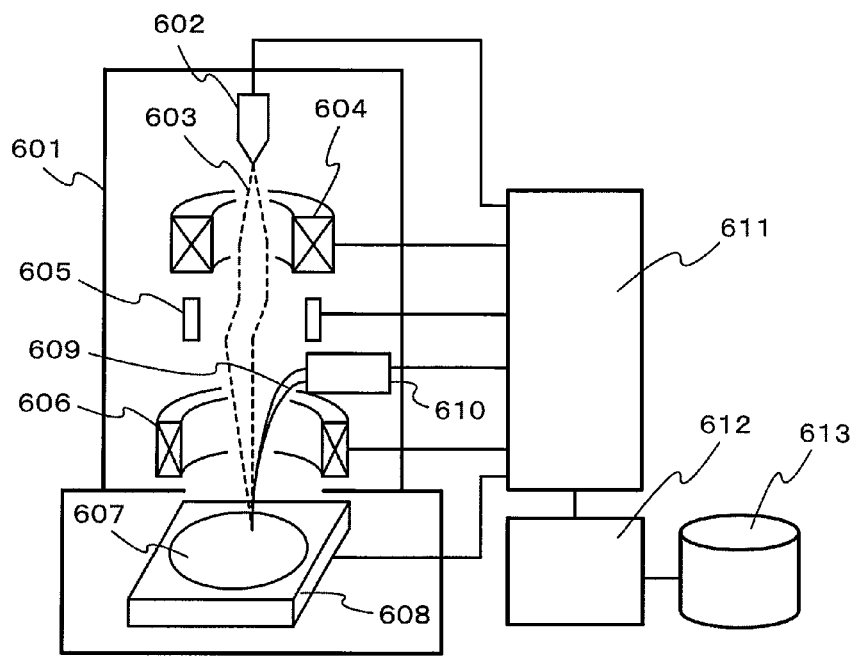
FIG. 6 is a schematic diagram showing a configuration of an apparatus for implementing the present invention.

FIG. 6 is a conceptual diagram showing a configuration of a fine pattern OL error measuring apparatus built into a critical-dimension scanning electron microscope (CD-SEM). Inside the enclosure 601 of the scanning electron microscope, an electron gun 602, a converging lens 604, a deflector 605, an objective lens 606, a sample stage 608, a secondary-electron detector 610 are included. And outside the enclosure 601, a control unit 611, a computer 612, and a recorder 613 are installed. The electron gun 602 emits a primary electron beam towards a sample 607 via the converging lens 604, the deflector 605, and the objective lens 606, and the detector 610 detects secondary electrons 609 returned from the sample. The electron gun 602, the converging lens 604, the deflector 605, the objective lens 606, and the sample stage 608 are each connected to and controlled by the control unit.

For OL error measurement, an operator first operates the computer 612 to send an instruction to a control circuit of the CD-SEM to convey the wafer 607, the sample, into the apparatus. The patterns shown in FIGS. 4 and 5 are formed on the wafer 607. The operator enters a data of height (H in FIG. 5) of the target patterns into a predetermined cell of a window displayed on a screen. The pattern height is 100 nm in the present embodiment. Next, the computer controls the stage so that visual field of the CD-SEM comes into a position substantially central portion of target pattern 405. After this, the operator electrically adjusts the converging lens 604, the objective lens 606, and the deflector 605, for a visual field of the CD-SEM to fall within the target pattern 405. The visual field of the CD-SEM is a square that measures 0.9 μm on one side. After that, execution of a measuring procedure which the operator has registered in advance causes the computer 612 to store a position of the target pattern 405 as its home position, bend the beam, observe the target patterns 401 to 409, and temporarily store image data of each pattern into an internal storage region of the computer 612. A control value Px of the converging lens 604, objective lens 606, and deflector 605, that indicates how far in an x-direction (horizontal direction in FIG. 4) the beam is bent while the beam is scanning a central portion of the image, is automatically stored into the internal storage region of the computer 612 simultaneously with the pattern observation. Hereinafter, the control value Px of the lenses 604, 606 and deflector 605, is called the beam deflection parameter. The beam deflection parameter Px also changes while scanning the beam on the sample. The value obtained when the beam is scanning the center of the image, however, is defined as a representative value of Px for one frame of image data. The beam deflection parameter may instead use an average value of Px obtained during scanning (i.e., Px of an average image).

Figure 7:
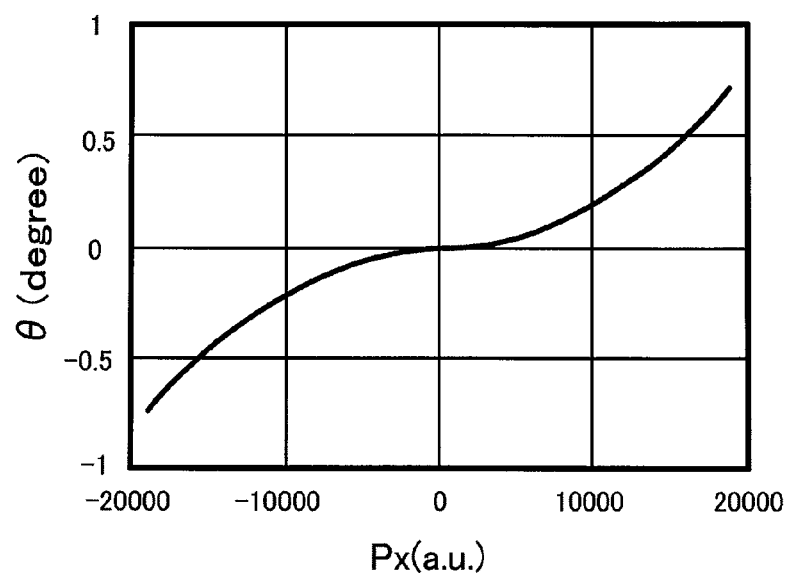
FIG. 7 is a graph representing a relationship between a parameter Px of an electron beam control system and an incident angle θ of an electron beam relative to a perpendicular direction, the electron beam control system being used in the first embodiment.

FIG. 7 is a graph representing a relationship between the beam deflection parameter Px in the X-direction and an incident angle θ of the beam relative to the sample. Referring to this graph, except that the pattern of interest is formed from a different material, θ is the same as that shown in FIG. 3. Numeric data equivalent to this graph is saved in the recorder 613 by simulation before the displacement measurement is conducted.

After sampling data, the computer 612 loads from the recorder 613 the data representing the relationship between Px and θ, and saves the loaded data in the internal storage region of the computer 612. Dimensions SL' and SR' of sections equivalent to SL and SR in FIG. 5 are calculated from the observed image as values to be measured. From expressions 2, 4, 5, and 6, OL can be derived as $$OL=(SL'-SR')/2+H \cdot \tan\theta \quad \text{(Expression 8)}$$

For each observed spot, the second term on a right side of this expression can be calculated from θ that has been calculated from Px of the image, and 100 nm that the operator has entered as H. The first term can be calculated directly from the observed image. The true OL error between the target patterns is determined from the calculations.

The target pattern 401 has the largest error Δ in the measurement of the OL error, and Px is −17,500. The data shown in FIG. 7 indicates that θ at this time is −0.6125°. A corresponding value of Δ is −1.07 nm. These results indicate that in the present invention, the OL error measurement by correcting a measurement error of 1 nm or more has been conducted at a speed equivalent to those achieved in conventional techniques.

As a result, about 20% of the wafers which have passed an OL error inspection under the conventional inspection technique has been rejected and, as a result, a yield improved by 5%.

Additionally, the OL error data measured in the present invention has been fed back into the lithographic apparatus to achieve a 25% reduction in the OL error itself. Another 5% improvement in yield has thus improved.

While only the correction in the X-direction has been introduced in the above example, a correction in a Y-direction can likewise be conducted by using line patterns extending in the X-direction.

Figure 8:
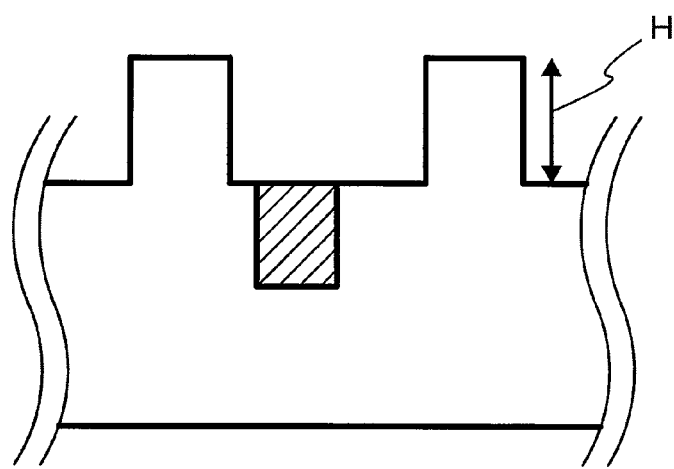
FIG. 8 shows an example of a cross sectional shape of the patterns whose overlay error can be measured in the first embodiment.

Furthermore, the patterns to be observed may have the section shown in any one of FIGS. 1, 2, and 8. In a case of FIG. 2, the operator needs to enter a value of "h", instead of H, that is the difference in height between the pattern formed by the first lithography process and the pattern formed by the second lithography process.

Alternatively, one of the patterns to be observed may be a closed pattern, such as a circular or elliptical one.

Second Embodiment

The second embodiment of the present invention is described below. The second embodiment, described below using FIGS. 3, 6, 9, and 10, is an example in which a square region that measures 2 μm on one side is observed and an OL error is measured with high accuracy from an image being observed.

As described in the first embodiment, Px also changes while one frame of image data is being scanned. Although the change usually is negligibly insignificant, it becomes not negligible with increasing visual field. An example of removing a measurement error due to such a Px change in the image is described in the present embodiment.

Figure 9:
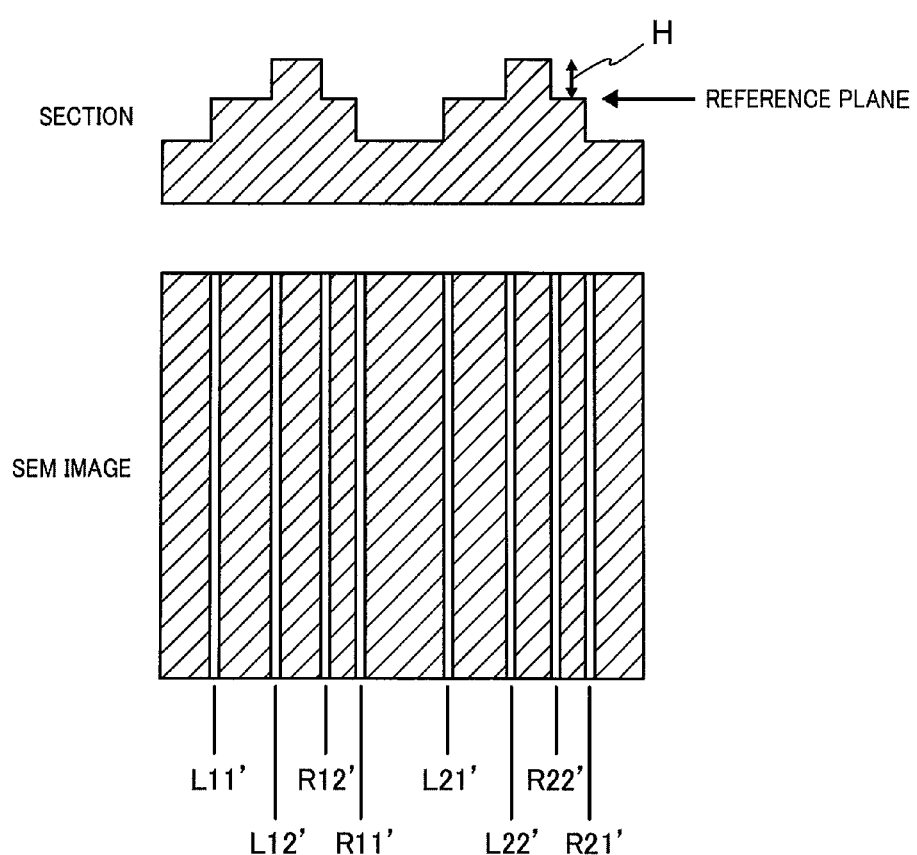
FIG. 9 is a schematic diagram showing a cross sectional shape of patterns and SEM image of them whose overlay error is measured in a second embodiment.

FIG. 9 is a schematic diagram showing a cross-sectional shape of a pattern section used to evaluate an OL error, and an image obtained when the patterns are observed through a CD-SEM. Two sets of edge position coordinates for obtaining a value OL' to be measured as the OL error, are included in the image. These edge positions are shown as Li1', Li2', Ri1', Ri2' in FIG. 9, wherein "i" has a value of 1 or 2. Upon regarding the four values as L1, L2, R1, R2, substituting each of them to a right side of expression 1, and calculating the OL error, the value OL' to be measured as the OL error between the observed (i.e., uncorrected) patterns can be obtained.

Figure 10:
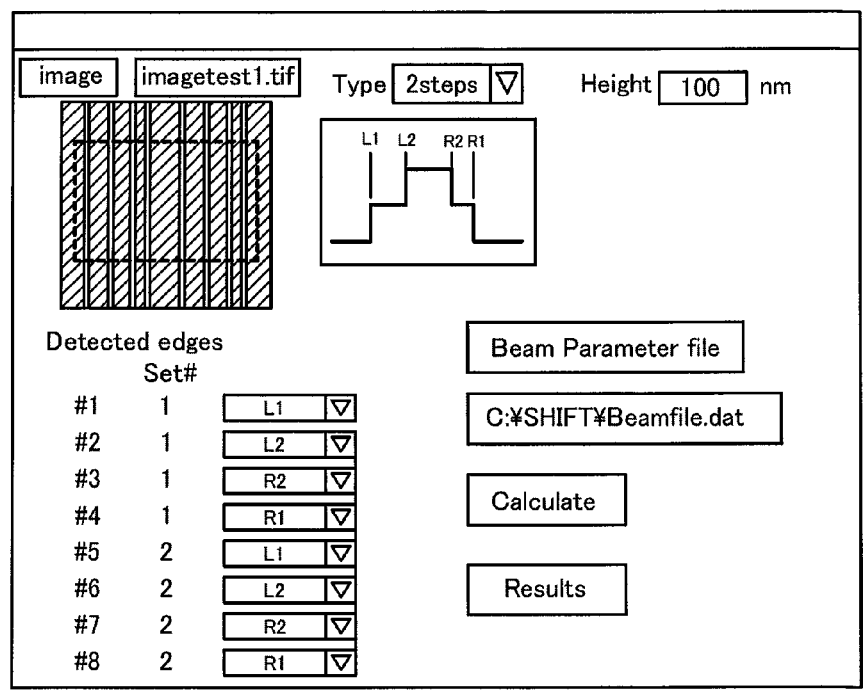
FIG. 10 is a GUI screen in the second embodiment.

At this time, Li1' and Ri1' can be defined using a signal produced by the pattern edges present on a datum plane in FIG. 10, whereas Li2' and Ri2' defined using a signal produced by pattern edges placed at a position which is higher by H than the datum plane are influenced by oblique incidence of the electron beam.

In order to remove this influence, the following procedure is executed.

First, an image for measuring the OL error is acquired using the apparatus shown in FIG. 6. During this image acquisition, beam deflection parameters (Px, Py) obtained when data on a position (x, y) in acquiring the image are recorded in the internal storage region of the computer 612.

Next, an "Image" button on a GUI screen shown in FIG. 10 is clicked to specify and display an image to be analyzed, and after a type of a cross sectional shape has been specified, eight edge lines are detected. Then, information of to which of L1, L2, R1, and R2 is each of the eight edges corresponding, height (here, 100 nm) from the datum plane, and the like are entered on the GUI screen. In addition, in order to enter a data file describing a relationship between Px, Py and θ, an angle of incidence, "Beam Parameter file" button is clicked to specify "Beamfile.dat" from a given path, load the beam parameter data from the recorder 613, and temporarily store the loaded data into the storage region of the computer 612. After this, entry of an OL error calculation instruction by a click on a "Calculate" button causes the computer 612 to calculate respective 0 values from both of "Beamfile.dat" and Px, Py obtained when Li2' and Ri2' are being scanned, and then to calculate edge positions from the 0 values, pursuant to expression 8. Here, "i" has a value of 1 or 2. The value of 0 changes according to edge position.

$$Li1 = Li1'$$

$$Ri1 = Ri1'$$

$$Li2 = Li2' + H \cdot \tan\theta$$

$$Ri2 = Ri2' + H \cdot \tan\theta \qquad \text{(Expression 9)}$$

The use of the thus-obtained edge positions Li1, Ri2, Li2, Ri2 allows respective OL errors to be obtained for the sets of "i=1" and "i=2", pursuant to expression 1. The OL error data is displayed by a click of a "Results" button. When the OL error calculations are conducted without the above correction, the OL error that has been obtained from the pattern of "i=1" is 15.7 nm, whereas that which has been obtained from the pattern of "i=2" is 15.0 nm. After the above correction, however, both are 15.4 nm.

Prior to adjustment of the lithographic apparatus, execution of measurements after the correction has been conducted allows OL error measurement reproducibility to be improved by 0.8 nm and an adjustment data acquisition time to be reduced by 30%.

It goes without saying that the OL error measuring apparatus of the present invention can be used in a state connected to a CD-SEM system.

The invention may be embodied in other specific forms without departing from the spirit or essential characteristics of the invention. The present embodiment is therefore to be considered in all respects as illustrative and not restrictive, the scope of the invention being indicated by the appended claims, rather than by the foregoing description, and all changes that come within the meaning and range of equivalency of the claims are therefore intended to be embraced therein.

The invention claimed is:

1. An apparatus for measuring a displacement, comprising:
an electron beam source for emitting an electron beam;
a converging lens for converging the electron beam emitted from the electron beam source;
a deflector for deflecting the electron beam converged by the converging lens;
an objective lens for converging, scanning and irradiating the electron beam deflected by the deflector onto a surface of a sample;
a sample stage for mounting the sample thereon and moving the sample in a plane;
a detector for detecting secondary electrons emanated from the sample by irradiating the sample with the electron beam;
an image forming unit that forms an image of the sample, based upon a detection signal corresponding to the secondary electrons emanated from the sample and detected by the detector;
a control unit for controlling the electron beam source, the converging lens, the deflector, the objective lens, the sample stage, the detector, and the image forming unit;
a computer that cooperates with the control unit and calculates the displacement between a plurality of patterns formed in different pattern-forming steps, wherein the calculation is based on a combination of a displacement amount between the plurality of patterns calculated from the sample image formed by the image forming unit and a displacement amount calculated from separately entered height information of the patterns formed in the different pattern-forming steps and information supplied from the control unit; and
a data recorder for recording the displacement between the patterns, calculated by the computer.

2. The displacement measuring apparatus according to claim 1, wherein
the computer includes:
an entry unit used to enter of data on the pattern height; and
a storage unit for temporary storing the image data formed by the image forming unit,
wherein the information from the control unit is data that represents correspondence between respective control values of the converging lens, objective lens, and deflector operative when the electron beam is being scanned, and an angle of incidence of the electron beam upon the sample during the scan, and
wherein the data recorder further records the correspondence value in advance.

3. The displacement measuring apparatus according to claim 2, wherein the respective control values of the converging lens, objective lens, and deflector operative when the electron beam is being scanned are values obtained while the electron beam is scanning a central portion of the image obtained during observation.

4. The displacement measuring apparatus according to claim 1,
wherein the computer further includes:
a graphical user interface screen, on which the computer provides a function that displays the pattern image, a function that enables entry of data on the pattern height, a function that calls the correspondence value recorded in the data recorder and temporarily stores the called value into a storage region of the computer, and a function that calculates the displacement and displays a result of the calculation.

5. The displacement measuring apparatus according to claim 1, wherein respective control values of the converging lens, objective lens, and deflector operative when the electron beam is being scanned are average values obtained while the secondary electrons from the sample are being detected by the detector.

6. The displacement measuring apparatus according to claim 1, wherein the data recorder stores numeric data which represents a relationship between a beam deflection parameter in one direction which is information supplied from the control unit and an incident angle of the beam relative to the sample.

7. A method for measuring a displacement, the method comprising the steps of:
entering height information of patterns formed on a sample, into a computer;
recording data that represents correspondence between control values of a converging lens, objective lens, and deflector of a scanning electron microscope observing the sample, the control values being used to control a direction of an electron beam incident upon the sample, and a deviation in an angle of incidence of the electron beam upon the sample with respect to a direction perpendicular to the sample;

storing into the computer the respective control values of the converging lens, objective lens, and deflector operative when the sample is being observed through the scanning electron microscope;

acquiring an image of the sample while observing the sample through the scanning electron microscope; and calculating the displacement between the patterns formed on the sample in different pattern-forming steps, wherein the calculation is based on a combination of a displacement amount calculated from a correspondence data recorded in the recording step, the computer-stored control values of the converging lens, objective lens, and deflector of the scanning electron microscope being used for the observation, and the pattern height value entered into the computer and a displacement amount between the plurality of patterns calculated from the pattern image acquired in the step of acquiring the image of the pattern.

8. The displacement measuring method according to claim 7, further comprising:

recording the control values of the converging lens, objective lens, and deflector that change during the observation through the scanning electron microscope;

determining a relationship between the deviation in angle and pattern edge coordinate positions in the image being observed, from the control values; and calculating the amount of displacement between the patterns, from all of the relationship between the angle deviation and the pattern edge coordinate positions in the image being observed, the pattern height, and the image being observed.

9. A scanning electron microscope system equipped with a displacement measuring apparatus, comprising:

a scanning electron microscope equipped with an electron beam source, a converging lens, a deflector, an objective lens, a sample stage, and a secondary-electron detector;

a control unit for controlling the electron beam source, the converging lens, the deflector, the objective lens, the sample stage, and the secondary-electron detector of the scanning electron microscope;

a data recorder for recording data that represents correspondence between respective control values of the converging lens, objective lens, and deflector operative when the scanning electron microscope is scanning an electron beam, and an angle of incidence of the electron beam upon a sample during the scan; and a computer including an entry unit for entering height information of patterns, and a storage region for temporary storage of image data obtained during imaging with the scanning electron microscope;

wherein the computer calculates the displacement between the patterns formed in different pattern-forming steps based on a combination of a displacement amount between the plurality of patterns calculated from all of the image data obtained during imaging with the scanning electron microscope and a displacement amount calculated from the pattern height information entered from the entry unit and the correspondence data recorded in the data recorder.

10. The displacement measuring apparatus according to claim 9, wherein the correspondence data recorded in the data recorder is numeric data which represents a relationship between a beam deflection parameter in one direction which is information supplied from the control unit and an incident angle of the beam relative to the sample.

* * * * *